United States Patent
Fournel et al.

(10) Patent No.: US 12,463,174 B2
(45) Date of Patent: Nov. 4, 2025

(54) METHOD FOR BONDING CHIPS TO A SUBSTRATE BY DIRECT BONDING

(71) Applicant: COMMISSARIAT A L'ENERGIE ATOMIQUE ET AUX ENERGIES ALTERNATIVES, Paris (FR)

(72) Inventors: Frank Fournel, Grenoble (FR); Loic Sanchez, Grenoble (FR); Brigitte Montmayeul, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 559 days.

(21) Appl. No.: 17/786,000

(22) PCT Filed: Dec. 17, 2020

(86) PCT No.: PCT/EP2020/086664
§ 371 (c)(1),
(2) Date: Jun. 16, 2022

(87) PCT Pub. No.: WO2021/122909
PCT Pub. Date: Jun. 24, 2021

(65) Prior Publication Data
US 2023/0029338 A1   Jan. 26, 2023

(30) Foreign Application Priority Data
Dec. 19, 2019   (FR) ...................... 19 14956

(51) Int. Cl.
*H01L 23/00* (2006.01)
*H01L 25/065* (2023.01)

(52) U.S. Cl.
CPC .............. *H01L 24/80* (2013.01); *H01L 24/08* (2013.01); *H01L 24/74* (2013.01);
(Continued)

(58) Field of Classification Search
CPC ......... H01L 24/80; H01L 24/08; H01L 24/74; H01L 2224/80004; H01L 2224/80085;
(Continued)

(56) References Cited

U.S. PATENT DOCUMENTS 10,217,718 B1    2/2019  Lam
2003/0064609 A1*  4/2003  Iseki ................. H01L 21/67778
                                                 438/758
(Continued)

FOREIGN PATENT DOCUMENTS

JP    2004-537158 A    12/2004
JP    2011-192663 A     9/2011
(Continued)

OTHER PUBLICATIONS

International Search Report issued Mar. 11, 2021 in PCT/EP2020/086664, filed on Dec. 17, 2020, 2 pages.
(Continued)

*Primary Examiner* — Tucker J Wright
(74) *Attorney, Agent, or Firm* — Oblon, McClelland, Maier & Neustadt, L.L.P.

(57) ABSTRACT

A process for bonding chips to a substrate by direct bonding includes providing a support with which the chips are in contact, the chips in contact with the support being separate from one another. This bonding process also includes forming a liquid film on one face of the substrate, bringing the chips into contact with the liquid film, where the action of bringing the chips into contact with the liquid film causes attraction of the chips toward the substrate, and evaporating the liquid film in order to bond the chips to the substrate by direct bonding.

15 Claims, 7 Drawing Sheets

(52) U.S. Cl.
CPC .............................. *H01L 25/0655* (2013.01); *H01L 2224/08221* (2013.01); *H01L 2224/80004* (2013.01); *H01L 2224/80085* (2013.01); *H01L 2224/80395* (2013.01)

(58) Field of Classification Search
CPC ....... H01L 2224/80395; H01L 21/6836; H01L 2221/68309; H01L 2221/68313; H01L 2224/75317; H01L 2224/7565; H01L 2224/80136; H01L 2224/80894; H01L 2221/68386; H01L 2224/95136; H01L 2224/95146

See application file for complete search history.

(56) References Cited

U.S. PATENT DOCUMENTS

| | | |
|---|---|---|
| 2004/0154733 A1 | 8/2004 | Morf |
| 2009/0023243 A1 | 1/2009 | Koyanagi |
| 2011/0249113 A1 | 10/2011 | Koyanagi |
| 2013/0045569 A1 | 2/2013 | Koyanagi |
| 2019/0252221 A1* | 8/2019 | Chen .................. H01L 21/6835 |
| 2020/0176437 A1 | 6/2020 | Wimplinger |

FOREIGN PATENT DOCUMENTS

| | | |
|---|---|---|
| WO | WO 02/063678 A1 | 8/2002 |
| WO | WO 2006/077739 A1 | 7/2006 |
| WO | WO 2018/157937 A1 | 9/2018 |

OTHER PUBLICATIONS

Eibelhuber, "Enabling silicon photonic through advances in III-V integration on silicon", Semiconductor Today, Compounds & Advanced Silicon, vol. 9, Issue 6, Jul./Aug. 2014, pp. 64-67.

Fukushima et al. "Transfer and Non-Transfer Stacking Technologies Based on Chip-to-Wafer Self-Assembly for High-Throughput and High-Precision Alignment and Microbump Bonding", IEEE 2015 International 3D Systems Integration Conference, 2015, pp. 134-137.

Menezo et al. "Advances on III-V on Silicon DBR and DFB Lasers for WDM optical interconnects and Associated Heterogeneous Integration 200mm-wafer-scale Technology", IEEE, 2014, 6 pages.

* cited by examiner

METHOD FOR BONDING CHIPS TO A SUBSTRATE BY DIRECT BONDING

TECHNICAL FIELD OF THE INVENTION

The technical field of the invention relates to the bonding of chips to a substrate by direct bonding, in particular in the field of electronics and more particularly of microelectronics.

STATE OF THE ART

The document "Advances on III-V on Silicon DBR and DFB Lasers for WDM Optical Interconnects and Associated Heterogeneous Integration 200 mm-wafer-scale Technology" by S. Menezo et al., published in 2014 IEEE Compound Semiconductor Integrated Circuit Symposium (CSICS) conference, describes a process for bonding chips by direct bonding to a receiving plate using a mechanical grip provided with cavities housing the chips to be bonded to the receiving plate. A disadvantage of using a mechanical grip having cavities for housing the chips before they are bonded is that, if the chips do not have identical thicknesses and if the cavities do not have identical depths, the faces to be bonded of the chips will not be included in one and the same plane: as a result, some chips might not bond to the receiving plate due to an absence of contact between these chips and the receiving plate as the mechanical grip and the receiving plate come together for the purpose of bonding the chips to the receiving plate. Moreover, such a process of bonding chips does not make it possible to precisely align each chip with the receiving plate.

In the context of the direct bonding of a chip to a substrate, the chip to be bonded can be positioned in a suitable manner using a technique of self-alignment by capillary action with a drop of water as is described, for example, in the document "Transfer and Non-Transfer Stacking Technologies Based on Chip-to-Wafer Self-Assembly for High-Throughput and High-Precision Alignment and Microbump Bonding" by Takafumi Fukushima et al. published in IEEE 2015 International 3D Systems Integration Conference, TS7.4.1 to TS7.4.4. This self-alignment technique nevertheless remains complex to implement in the sense that it requires providing hydrophilic and hydrophobic areas on the chip to be bonded and providing a suitable amount of water in order to ensure appropriate positioning of the chip during its bonding to the substrate made possible by virtue of the evaporation of the water interposed between the substrate and the chip. This solution is thus difficult to implement, in particular if it has to be applied for bonding of several chips to the substrate. Moreover, this solution also exhibits a not insignificant cost because it requires modifying the chip by forming the hydrophobic structure thereon.

There thus exists a need to develop a reliable and easy-to-implement solution for bonding chips to a substrate by direct bonding.

Subject Matter of the Invention

The aim of the invention is to facilitate the bonding of several chips to a substrate.

To this end, the invention relates to a process for bonding chips to a substrate by direct bonding, the bonding process comprising a stage of providing a support with which the chips are in contact with the support being separate from one another. This bonding process is characterized in that it comprises a stage of formation of a liquid film on one face of the substrate, a stage of bringing the chips into contact with the liquid film, which action of bringing the chips into contact with the liquid film causes an attraction of the chips toward the substrate, and a stage of evaporation of the liquid film in order to bond the chips to the substrate by direct bonding.

This makes it possible for the bonding process to carry out bonding of the chips, also called collective bonding of the chips, to the substrate while making it possible, via the liquid film, to absorb differences in level between the chips to be bonded. More particularly, the differences in level are differences in level between bonding faces of the chips, these bonding faces being intended to come into contact with the substrate in order to be bonded thereto by direct bonding.

The bonding process can additionally comprise one or more of the following characteristics:
  the liquid film is a film of deionized water;
  the stage of formation of the liquid film is such that the liquid film is deposited on the face of the substrate by centrifuging;
  the stage of bringing the chips into contact with the liquid film is carried out by bringing the substrate and the support together;
  the bonding process comprises the use of at least one abutment arranged between the substrate and the support to halt the operation of bringing together which provides for the chips to be brought into contact with the liquid film, from which it results that, at the moment when this bringing together is halted: the chips are in contact with the liquid film and the liquid film separates each chip from the substrate;
  the support is a mechanical grip on which the chips rest;
  the mechanical grip comprises cavities, each chip being positioned in a cavity and protruding from this cavity, and the bonding process comprises a stage of removal of the chips from the cavities, the stage of removal of the chips being implemented after the chips are brought into contact with the liquid film and before the chips are bonded to the substrate;
  the stage of removal of the chips from the cavities is carried out by moving the support and the substrate apart;
  the bonding process is such that the support provided comprises an adhesive film on which the chips are bonded; the adhesive film exhibits an elasticity such that it deforms during the evaporation stage, and, after bonding of the chips to the substrate, the bonding process comprises a stage of removal of the adhesive film;
  the stage of removal of the adhesive film comprises a stage of treatment of the adhesive film by heating the adhesive film or by exposure of the adhesive film to ultraviolet radiation;
  the bonding process comprises positioning the abutment on the mechanical grip and bringing the substrate into contact with the abutment after having positioned the abutment on the mechanical grip, and, at the moment of the contact of the substrate with the abutment, the chips are in contact with the liquid film;
  the bonding process comprises bonding the abutment to the adhesive film and bringing the abutment into contact with the substrate after the bonding of the abutment to the adhesive film, and, at the moment of the contact of the abutment with the substrate, the chips are in contact with the liquid film;

the substrate is kept horizontal to plus or minus 1 degree, and preferentially to plus or minus 0.1 degree, during the evaporation stage.

Other characteristics and advantages may emerge from the detailed description which will follow.

BRIEF DESCRIPTION OF THE DRAWINGS

A better understanding of the invention will be obtained on reading the detailed description which will follow, given solely by way of nonlimiting example and made with reference to the appended drawings listed below.

In these figures, the same references are used to designate the same elements.

DETAILED DESCRIPTION

Direct bonding corresponds to bonding by molecular adhesion during which two surfaces adhere without the application of an intermediate adhesive.

In the present description, the term "of between two values" is understood to mean that the limits defined by these two values are included in the range of values under consideration.

In the present description, a bringing together of two elements or a bringing together between two elements corresponds to rendering them closer in space, either by bringing one of the two elements toward the other of the two elements, which remains fixed, or by bringing the two elements together by moving both. The same principle applies for a moving apart of two elements.

Figure 1:
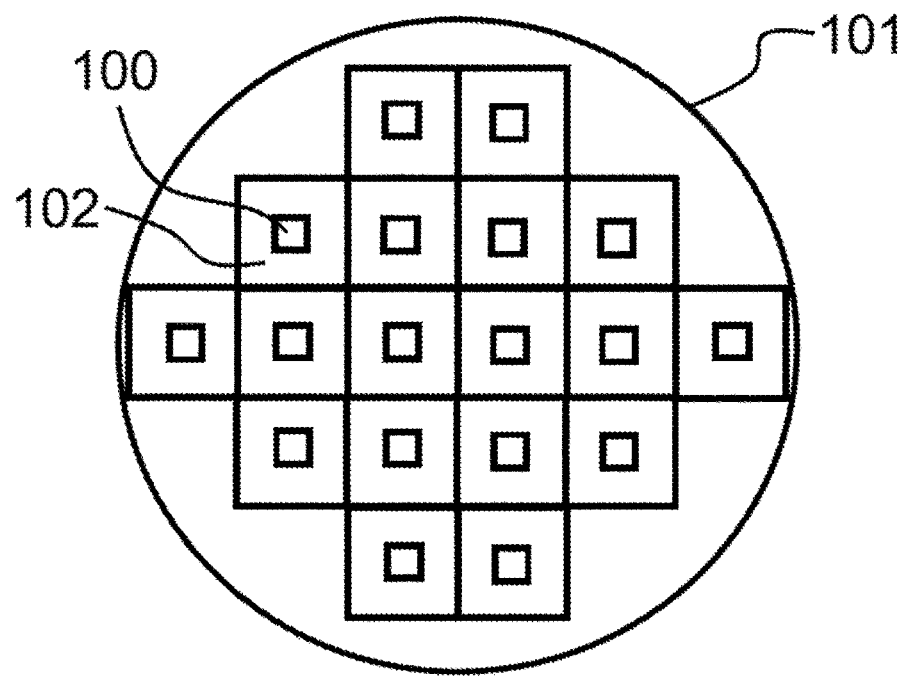
FIG. 1 represents chips bonded to a substrate via a bonding process according to the invention.

The method of bonding chips 100 to a substrate 101 by direct bonding makes it possible, for example, to obtain what is visible in FIG. 1, where the chips 100 are bonded to the substrate 101. The bonding process can comprise the stages visible in FIG. 2. An example of a first embodiment of this bonding process is illustrated in FIGS. 3 to 9 showing in particular side views. An example of a second embodiment of this bonding process is illustrated in FIGS. 3 and 10 to 16 showing in particular side views for FIGS. 10 and 12 to 16 with partial section of a support 105 and a top view for FIG. 11.

The chips 100 may or may not have undergone technological stages of microelectronics (such as, for example, material deposition, photolithography, etching). For example, a chip which has undergone technological stages of microelectronics can comprise a circuit and routing levels. The chips 100 can comprise, or be based on, silicon, indium phosphide (InP), gallium arsenide (GaAs), silicon carbide (SiC), silica, germanium or sapphire and these chips 100 can exhibit, at the surface, layers of materials, such as silica, silicon nitride, metals, such as copper or titanium, and all other layers known from microelectronics, such as a layer of hafnium dioxide ($HfO_2$), organosilicon material (SiOC), aluminum nitride (AlN) or alumina ($Al_2O_3$). The chips 100 can be electronic chips also called "dies".

The substrate 101 can preferably comprise electronic components 102 (FIG. 1) to be linked or connected, preferably electrically, to the chips 100 by direct bonding of these chips 100 to the substrate 101. The substrate 101 can be a wafer, also called a slice, for example of silicon, for example obtained after cutting a silicon ingot, to which technological stages have been applied to form the electronic components 102. The substrate 101 comprising the electronic components 102 is also called functionalized substrate 101. FIG. 1 illustrates in particular the chips 100 bonded by direct bonding to the substrate 101 comprising the electronic components 102, each electronic component 102 being, for example, bonded to only one of the chips 100. According to the nonlimiting example represented in FIG. 1, eighteen chips 100 are each connected to a corresponding electronic component 102.

The bonding process comprises a stage E1 of formation of a liquid film 103 on a face 104 of the substrate 101. Thus, the bonding process can, prior to this stage E1, comprise a stage of providing the substrate 101. For example, in FIG. 3, the face 104 of the substrate 101 is that on which the chips 100 have to be bonded by direct bonding. The face 104 of the substrate 101 is preferably planar. The role of this liquid film 103 will be to attract the chips 100, in particular by capillary action, toward the substrate 101.

Figure 4:
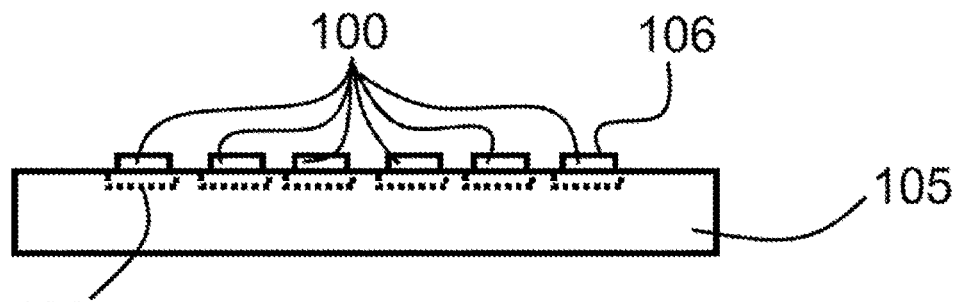
FIG. 4 illustrates, seen from the side, a support for chips supporting the chips to be bonded to the substrate.
Figure 10:
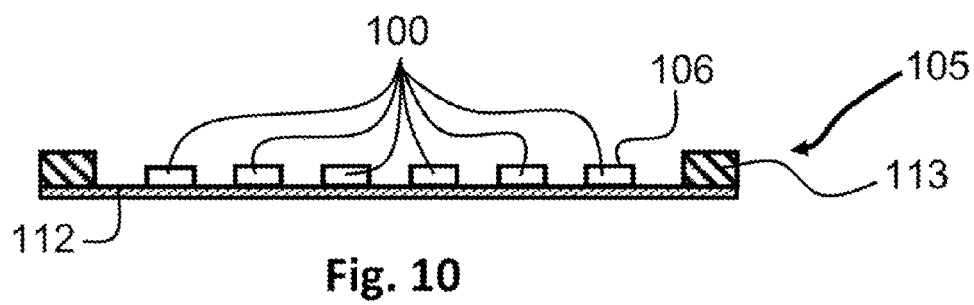
FIG. 10 illustrates, in the context of a second embodiment of the bonding process, a sectional view of a support for chips comprising an adhesive film to which the chips are bonded.
Figure 11:
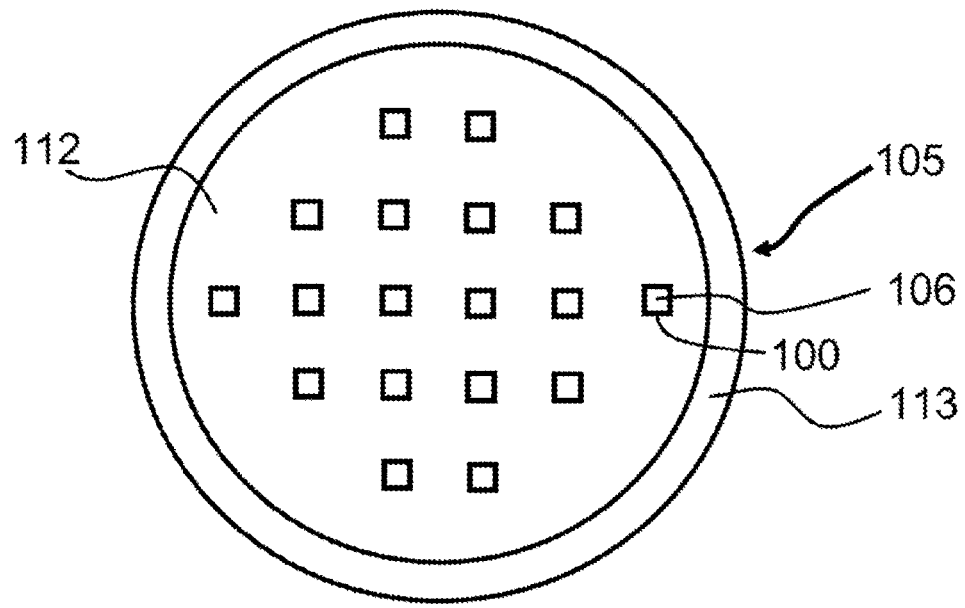
FIG. 11 illustrates a top view of the support of FIG. 10.

The bonding process also includes a stage E2 of providing a support 105 with which the chips 100 to be bonded to the substrate 101 are in contact. In other words, the provision stage E2 makes it possible to provide the support 105 and the chips 100 then in contact with the support 105. FIGS. 4 and 10 show two specific implementations of the support 105 which are described in more detail below and which can be used respectively in the first embodiment and in the second embodiment. The advantage of such a support 105 is to be able to simultaneously present the chips 100 for their bonding to the substrate 101 for the purpose of carrying out a collective bonding of these chips 100 to the substrate 101.

The chips 100 in contact with the support 105 are separate from one another. It is understood by "chips 100 separate from one another" that these chips 100 are not arranged within a wafer, or slice, which has made possible their formation. In particular, the chips 100 which are separate from one another are chips 100 cut out from one or more wafers, this possibly causing the chips 100 that are to be bonded to the substrate 101 to not all have the same thickness, thus making the collective bonding of these chips 100 to the substrate 101 more difficult.

The bonding process comprises a stage E3 of bringing the chips 100 into contact with the liquid film 103 (FIG. 6 according to the first embodiment and FIG. 13 according to the second embodiment), the bringing of the chips 100 into contact with the liquid film 103 causing an attraction of the chips 100 toward the substrate 101. This attraction is an attraction by capillary action.

In particular, as soon as there is contact between the chips 100 and the liquid film 103, the forces of capillary action cause an attraction to put the chips 100 at an equilibrium distance with respect to the substrate 101.

Figure 2:
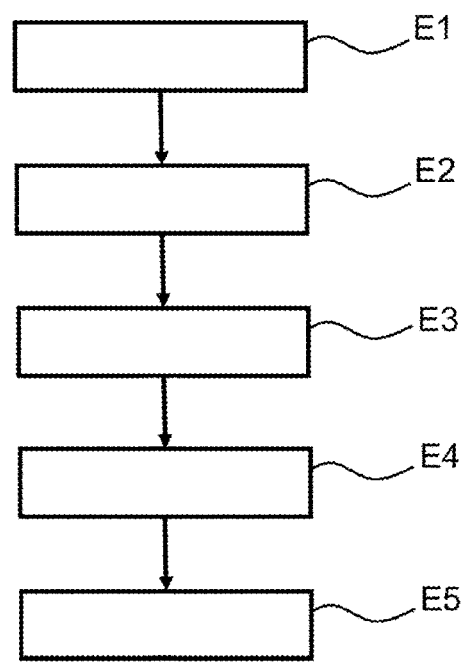
FIG. 2 diagrammatically illustrates stages of the bonding process according to a specific embodiment of the invention.

In FIG. 2, stage E2 is represented after stage E1 but their order is not of importance.

Figure 13:
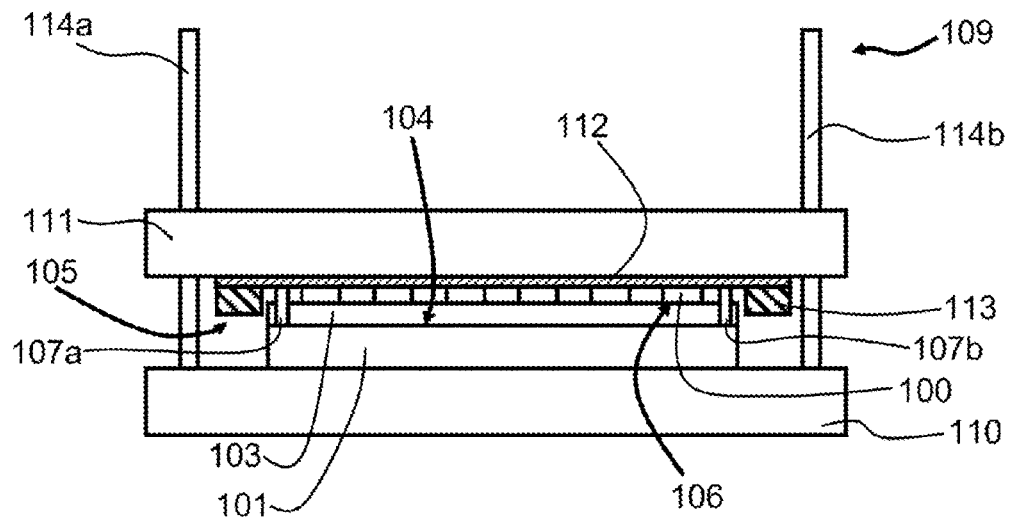
FIG. 13 illustrates, according to the second embodiment, bringing the chips, bonded to the adhesive film, into contact with the liquid film formed on the substrate.
Figure 14:
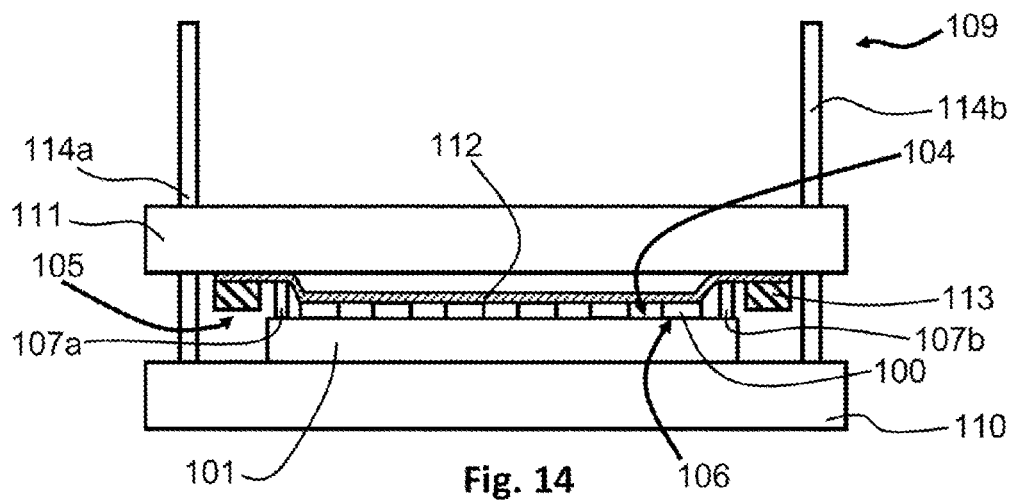
FIG. 14 illustrates, according to the second embodiment, the result of the evaporation of the liquid film having led to the bonding of the chips to the substrate.

The bonding process also comprises a stage E4 of evaporation of the liquid film 103 to bond the chips 100 to the substrate 101 by direct bonding. In particular, the evaporation stage E4 makes possible the evaporation of the liquid film 103 with which the chips 100 are in contact. Thus, at the end of the stage E4 of evaporation of the liquid film 103, the chips 100 are bonded to the substrate 101, in particular to the face 104 of the substrate 101, by direct bonding (FIGS. 9 and 14). The evaporation stage E4 leading to the bonding of the chips 100 is illustrated by the passage from FIG. 8 to FIG. 9 within the context of the first embodiment and by the passage from FIG. 13 to FIG. 14 within the context of the second embodiment. This is because, during the evaporation stage E4, the capillary action between the liquid film 103 and the chips 100 is such that the chips 100 are maintained with respect to the liquid film 103 until the chips 100 are brought into contact with the face 104 of the substrate 100, in particular after the evaporation stage E4, which results in the implementation of the direct bonding. In other words, the bonding process can comprise a stage E5 of bonding of the chips 100 by direct bonding implemented after the evaporation stage E4.

The evaporation of the liquid film 103 makes it possible to reduce the volume of the liquid film 103 and the capillary action continues to ensure the attraction of the chips 100 toward the substrate 101.

It results from the implementation of stages E1, E2, E3 and E4 that the use of the liquid film 103 makes it possible to compensate for differences in thickness of the chips 100 or more generally differences in level of bonding faces 106 of the chips 100. The bonding faces 106 of the chips 100 are the faces to be brought into contact with the substrate 101 in order to bond the chips 100 thereto. Each chip 100 thus comprises a bonding face 106 (FIGS. 4 to 16). Each bonding face 106 is preferably orthogonal to the direction of measurement of the thickness of the chip 100 which comprises this bonding face 106. Since the bonding faces 106 are not necessarily in one and the same plane when the chips 100 are in contact with the support 105, the liquid film 103 makes it possible to take charge of the difference in level between the bonding faces 106 for the purpose of making it possible to bring all the chips 100 into contact with the substrate 101. Furthermore, bringing the chips 100 into contact with the liquid film 103 makes it possible for them to be gripped by capillary action in order to subsequently bring them and the substrate 101 together as the liquid film 103 evaporates until the chips 100 are brought into contact with the substrate 101, from which the desired direct bonding will result.

Figure 3:
FIG. 3 represents, seen from the side, a substrate on which a liquid film is formed.

The liquid film 103, such as an example which can be seen in FIG. 3, is preferably a film of deionized water. Deionized water exhibits the advantage of not leaving any residue after evaporation. Deionized water in the film form exhibits the advantage of being compatible with the substrate 101 when the latter is completely hydrophilic or when its face 104 is hydrophilic, and with the chips 100 when they are completely hydrophilic or when at least the bonding faces 106 are hydrophilic. This thus does not require providing a structure having hydrophilic zones and having hydrophobic zones which is complex to produce; the bonding process is then simple to carry out.

Preferably, the liquid film 103 is continuous in the sense that it is present over the whole of a surface of the substrate 101, for example this surface being that of the face 104 of the substrate 101, it being possible for the thickness of the liquid film 103 to vary locally.

The thickness of the liquid film 103 can be of between 10 µm and 100 µm. Of course, the thickness of the liquid film 103 will be adapted according to the difference in level between the bonding faces 106 of the different chips 100, in particular to prevent any direct contact of one of the chips 100 with the surface of the substrate 101 before the evaporation stage E4. For example, for a liquid film 103 with a thickness of 100 µm, it is possible to compensate for differences in level between the bonding faces 106 of the different chips to be bonded which can range, without reaching it, up to plus or minus 50 µm.

Figure 17:
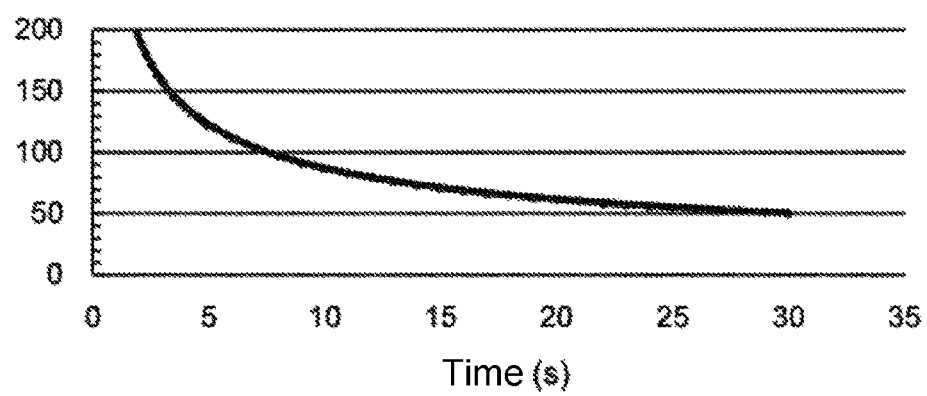
FIG. 17 illustrates the thickness in micrometers of a film of deionized water which can be obtained on a substrate according to a deposition by centrifuging as a function of the time in seconds of the centrifuging.

There results, from what has been described above, a need to find a solution for forming the liquid film 103 on the face 104 of the substrate 101 preferably while ensuring a suitable thickness of this liquid film 103. To meet this need, the stage E1 of formation of the liquid film 103 can be such that the liquid film 103 is deposited on the substrate 101, in particular on the face 104 of the substrate 101, by centrifuging. The technique of deposition by centrifuging is very particularly suitable for obtaining the desired liquid film 103, in particular when the liquid film 103 is formed of deionized water. For example, deposition by centrifuging at 30 revolutions per minute while taking 20 seconds for centrifuging makes it possible to obtain a film of deionized water of the order of 50 µm to 75 µm in thickness on the substrate 101. FIG. 17 gives an example of the thickness of the liquid film 103 formed of deionized water (Thickness of water (µm)) which can be obtained during such a centrifuging as a function of the time of the centrifuging. Thus, the rotation time of the substrate 101 and the rotation speed of the substrate 101, to make possible the deposition by centrifuging of the liquid film 103 on this substrate 101, make it possible to control the thickness of the liquid film 103, for example of between 10 µm and 100 µm.

Preferably, the liquid film 103 is such that it exhibits a contact angle of less than 10 degrees, and preferably of less than 5 degrees, on the substrate 101. Similarly, the liquid film 103 is such that it exhibits a contact angle of less than 10 degrees, and preferably of less than 5 degrees, on each of the chips 100. Such contact angles exhibit the advantage of guaranteeing a very good hydrophilicity and thus a high capillary force, which are particularly suited to the implementation of the bonding process.

Figure 6:
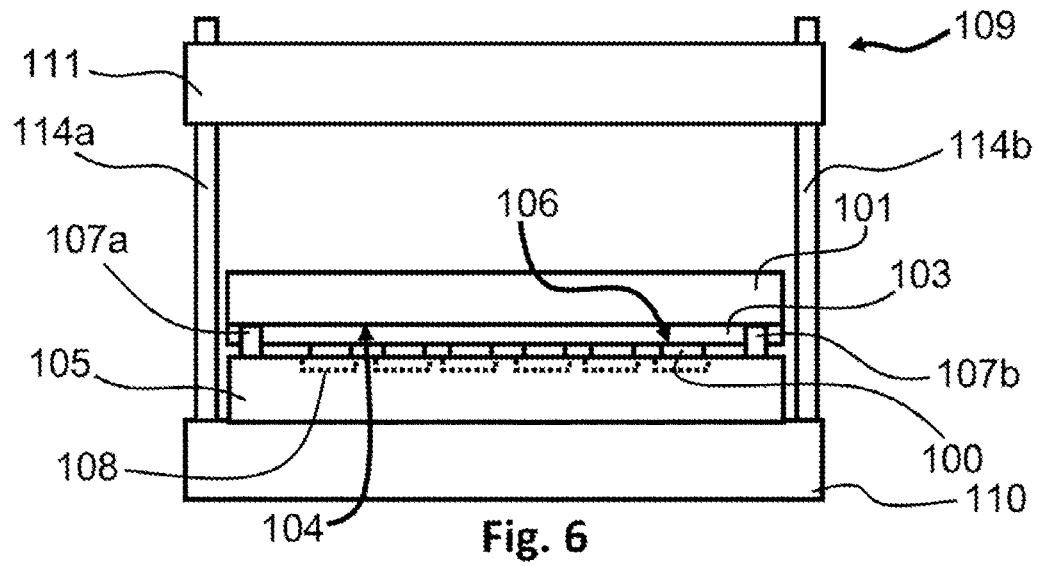
FIG. 6 illustrates, according to the first embodiment, the transfer of the liquid film and of the substrate above the support.
Figure 7:
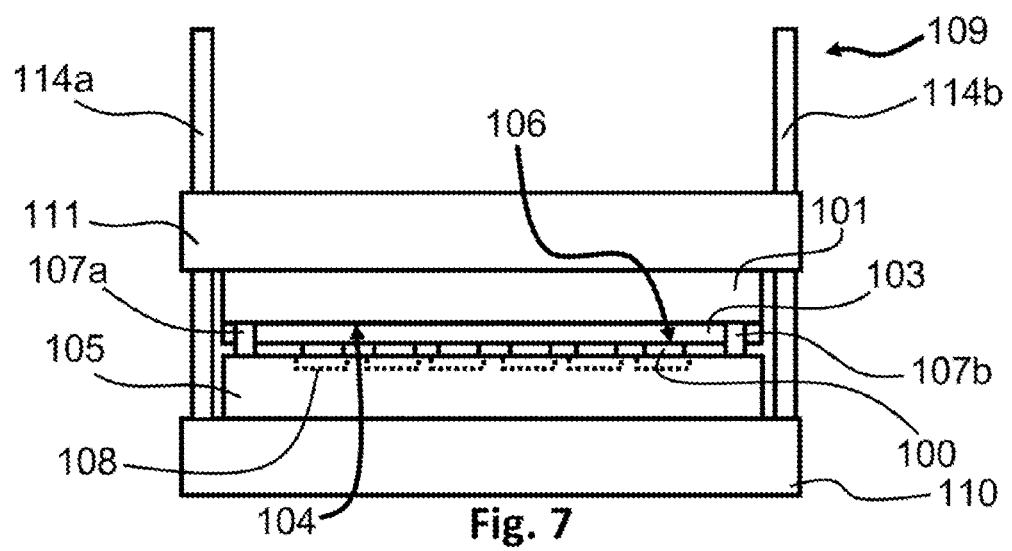
FIG. 7 illustrates, according to the first embodiment, gripping of the substrate by an upper support element of the machine.
Figure 12:
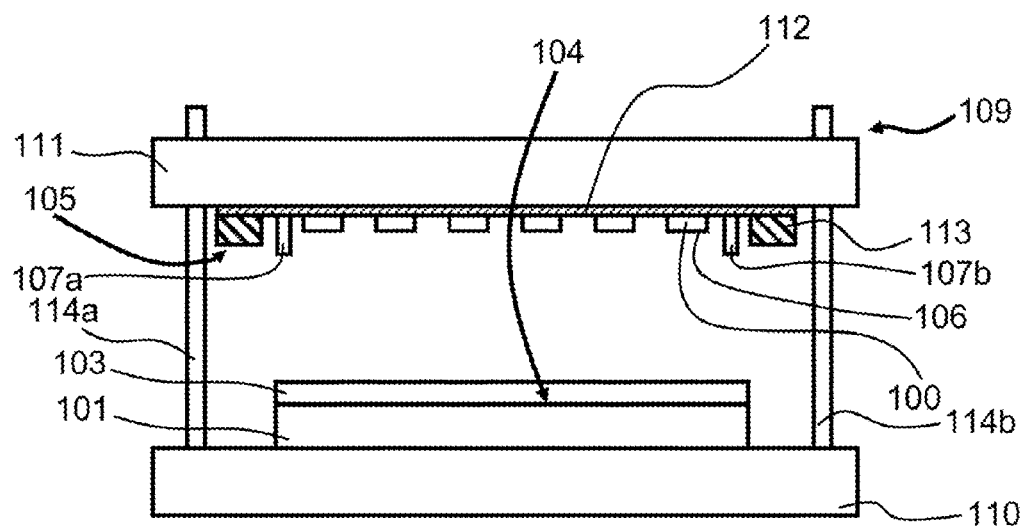
FIG. 12 illustrates, according to the second embodiment, the positioning of the support of FIG. 10, of the substrate and of the liquid film of FIG. 3 in a machine for the implementation of the bonding process.

The stage E3 of bringing the chips 100 into contact with the liquid film 103 can be ensured by bringing the substrate 101 and the support 105 together. Such a bringing together exhibits the advantage of simultaneously bringing together the chips 100 and the substrate 101 for the purpose of bringing these chips 100 into contact with the liquid film 103 which will subsequently make possible, by virtue of its evaporation, the desired direct bonding. FIG. 6 shows, according to the first embodiment, that this bringing together makes it possible to bring the chips 100 into contact with the liquid film 103 formed at the face 104 of the substrate 101. The passage from FIG. 12 to FIG. 13 shows this bringing together in the context of the second embodiment.

The evaporation of the liquid film 103 makes possible slow bonding, in comparison with directly, without use of the liquid film, bringing the chips into contact with the substrate on which they have to be bonded. Without the liquid film, the bonding is thus rapid and results in the appearance of defects, the appearance of which is limited with the liquid film 103.

It was mentioned above that the evaporation of the liquid film 103 made it possible to bring the chips 100 into contact with the substrate 101. There thus exists a need to ensure that, at a given moment, the chips 100 are in contact with the liquid film 103 then interposed between each of the chips 100 and the substrate 101 in order for it to be the evaporation of the liquid film 103 which brings the chips 100 into contact with the substrate 101. To meet this need, the bonding process can comprise the use of at least one abutment 107a, 107b, also called wedge, arranged between the substrate 101 and the support 105 to halt the bringing together ensuring that the chips 100 come into contact with the liquid film 103, from which it results that, at the moment when the bringing together is halted, the chips 100 are in contact with the liquid film 103, and the liquid film 103 separates each chip 100 from the substrate 101. Thus, the abutment(s) 107a, 107b facilitate the halting of the bringing together at the right time. FIGS. 5 to 9 and 12 to 16 show the use of two abutments 107a, 107b. Subsequently, the slow evaporation of the liquid film 103 makes it possible to bring the chips 100 and the substrate 101 together until the bonding of the chips 100 to the substrate 101 is obtained, this making it possible to limit the appearance of the defects mentioned above and which are characteristic of bringing the chips into contact with the substrate directly without use of a liquid film.

Preferably, as the support 105 and the substrate 101 are brought together, the support 105 and the substrate 101 are each kept horizontal to plus or minus 1 degree and preferentially to plus or minus 0.1 degree. This horizontality of the substrate 101 makes it possible to prevent the liquid film 103 from sliding over the substrate 101. This horizontality also exhibits the advantage of not needing an excessively thick liquid film 103 to touch all of the chips 100 with this liquid film 103. These horizontalities are in particular also maintained at least until the direct bonding of the chips 100 to the substrate 101. The liquid film 103 can be maintained using forces of capillary actions on the substrate 101, for example when the substrate 101 is turned over. The use of one or more abutments 107a, 107b also makes it possible to maintain the horizontality and also not to need an excessively thick liquid film 103 to touch all of the chips 100.

Thus, in a preferred way, the substrate 101, and preferably its face 104 which is then flat, is kept horizontal to plus or minus 1 degree, and preferentially to plus or minus 0.1 degree, during the evaporation stage E4 to prevent the liquid film 103 from sliding over the substrate 101, which would also result in a misalignment of the chips 100 with respect to the substrate 101.

The support 105 can be a mechanical grip, for example formed by a plate which is in particular rigid, on which the chips 100 rest. Thus, the contact of the chips 100 with the substrate 101 can be a contact by gravity, for example, not requiring the chips 100 to be fixed to the substrate 101. In the context of the first embodiment, the mechanical grip is used as support 105. The advantage of using a mechanical grip is that it makes it possible to use techniques for cleaning the chips 100 before they are bonded to the substrate 101 without degrading the mechanical grip carrying these chips 100 during the cleaning; for example, for this, the mechanical grip can be made of silicon, silicon dioxide, sapphire, germanium, silicon carbide, alumina or silicon nitride. This grip can be composed solely of one of these materials or at least be coated with one of these materials. One cleaning technique can be an $O_2$ plasma making it possible to remove any hydrocarbon contamination at the surface of the chips 100. Another cleaning technique can be a megasonic treatment making it possible to remove particulate contamination of the chips 100 due to the cutting of them. The megasonic treatment is a treatment known to a person skilled in the art, as is shown, for example, by the document "Innovative megasonic cleaning technology evaluated through direct wafer bonding" by F. Fournel et al., published in ECS Transactions, 33 (4), 495-500 (2010).

Figure 8:
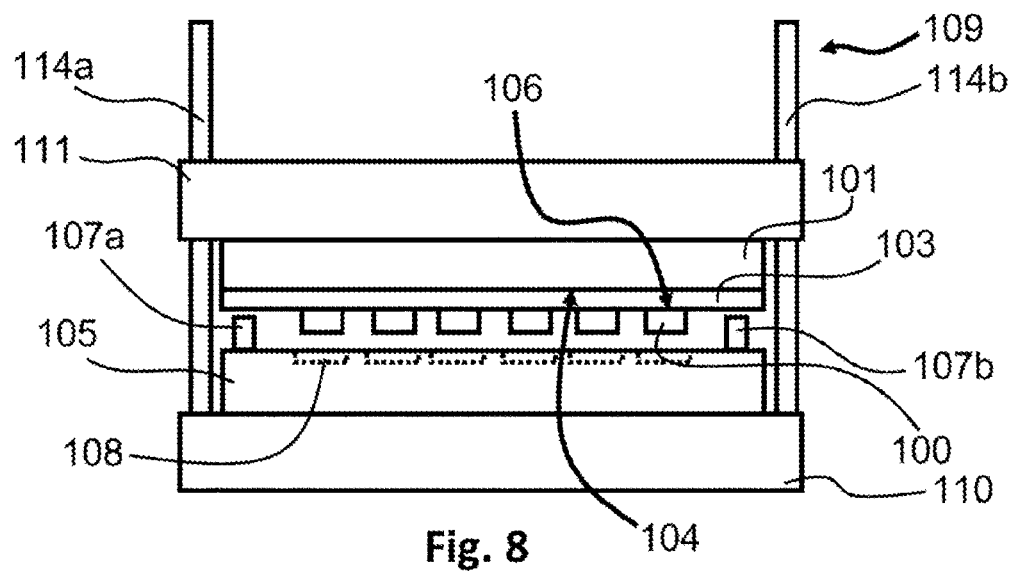
FIG. 8 illustrates, according to the first embodiment, a moving apart of the substrate and of the support.
Figure 9:
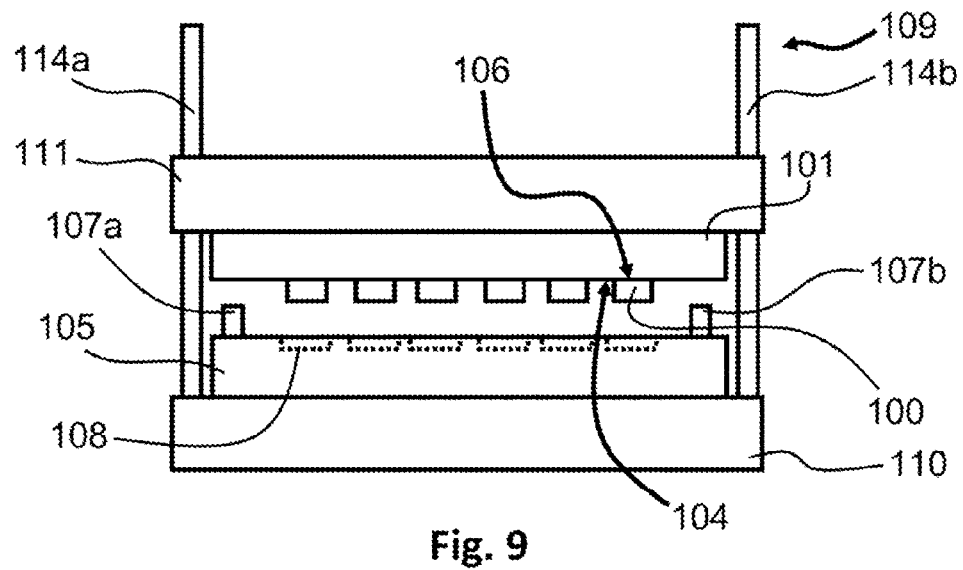
FIG. 9 illustrates, according to the first embodiment, the result of the evaporation of the liquid film having led to the bonding of the chips to the substrate.

The mechanical grip can comprise cavities 108, each represented diagrammatically in dotted lines in FIGS. 4 to 9, each chip 100 being positioned in a cavity 108 and protruding from this cavity 108, in particular before the stage E3 of bringing the chips 100 into contact with the substrate 101. Preferably, each cavity 108 of the mechanical grip houses only one of the chips 100. In this case, the chips 100 are withdrawn/extracted from the cavities 108 before the chips 100 are bonded to the substrate 101 (FIG. 8). Thus, the bonding process can comprise a stage of removal of the chips 100 from the cavities 108 making it possible thus to take the chips 100 out of the cavities 108, the stage of removal of the chips 100 being carried out after the chips 100 have been brought into contact with the liquid film 103 before the bonding of the chips 100 to the substrate 101. The cavities 108 make it possible to position the chips 100 in a suitable manner for the purpose of bonding them to the substrate 101. The fact that the chips 100 protrude from the cavities 108 makes it possible for the liquid film 103 to come into contact with the chips 100 without bringing the liquid film 103 into contact with the support 105, for example by using the abutment(s) 107a, 107b described above to avoid contact of the liquid film 103 with the support 105. Subsequently, the removal of the chips 100 from the cavities 108 before the bonding to the substrate 101 (FIG. 8) makes it possible to avoid mechanical locking of the chips 100 in the cavities 108 at the time of the bonding (FIG. 9). This is because, if the chips 100 were still at least partially in the cavities 108 during the bonding of the chips 100 to the substrate 101, this might result in locking of the substrate 101, with respect to the support 105, if several chips 100 were to press against the substrate 101 while being in contact with side walls of the cavities 108. The chips 100 can be withdrawn from the cavities 108 in a simple way by moving the substrate 101 and the support 105 apart, preferably at least by a distance equal to the thickness of the thickest chip 100 among the chips 100 to be bonded to the substrate 101.

Of course, during the moving apart, the capillary action between the liquid film 103 and the chips 100 ensures the maintenance of the chips 100 with the liquid film 103. The depth of the cavities 108 is, of course, adapted to the chips 100 and in particular to their thickness: for each chip 100 to protrude from the cavity 108 in which it is placed, the thickness of said chip 100 is strictly greater than the depth of the cavity 108 in which this chip 100 is placed (the chip 100 extending along its thickness from the bottom of the cavity 108 before the chip 100 is brought into contact with the liquid film 103). For example, the cavities 108 can exhibit a depth of between 400 µm and 500 µm, such cavities being suitable for each receiving a chip 100 with a thickness of between 500 µm and 600 µm.

In particular, each cavity 108 is an open cavity 108 comprising a bottom and a side wall linking the bottom to the opening of the cavity. In this case, each chip 100 which rests on the support 105:
has its bonding face 106 located outside the cavity 108, and
exhibits a face, opposite to its bonding face 106 along the thickness of the chip 100, in contact with the bottom of the cavity 108.

For example, to withdraw the chips 100 from the cavities 108, the support 105 and the substrate 101 can be moved apart, for example by moving the support 105 and/or the substrate 101. In other words, the stage of removal of the chips 100 from the cavities 108 can be carried out by moving the support 105 and the substrate 101 apart. This moving apart thus makes it possible to meet the need for removal of the chips 100 from the cavities 108.

Alternatively, if the depth of the cavities 108 allows it, the simple bringing of the chips 100 into contact with the liquid film 103 and the resulting attraction of the chips 100 toward the substrate 101 makes it possible to extract the chips 100 from the cavities 108. All the chips 100 are then extracted from the cavities before the bonding of these chips 100 to the substrate 101.

The bonding process can comprise, when the abutment(s) 107a, 107b are used, positioning the abutment(s) 107a, 107b on the mechanical grip and bringing the substrate 101 into contact with the abutment(s) 107a, 107b after having positioned the abutment(s) 107a, 107b on the mechanical grip. This makes it possible to guarantee perfect parallelism and an appropriate distance between the chips 100 and the substrate 101, and thus to guarantee that the liquid film 103 will touch the different chips 100 in the same way. In this case, at the moment of contact, that is to say of the bringing of the substrate 101 into contact with the abutment(s) 107a, 107, the chips 100 are in contact with the liquid film 103 (FIG. 6).

Figure 5:
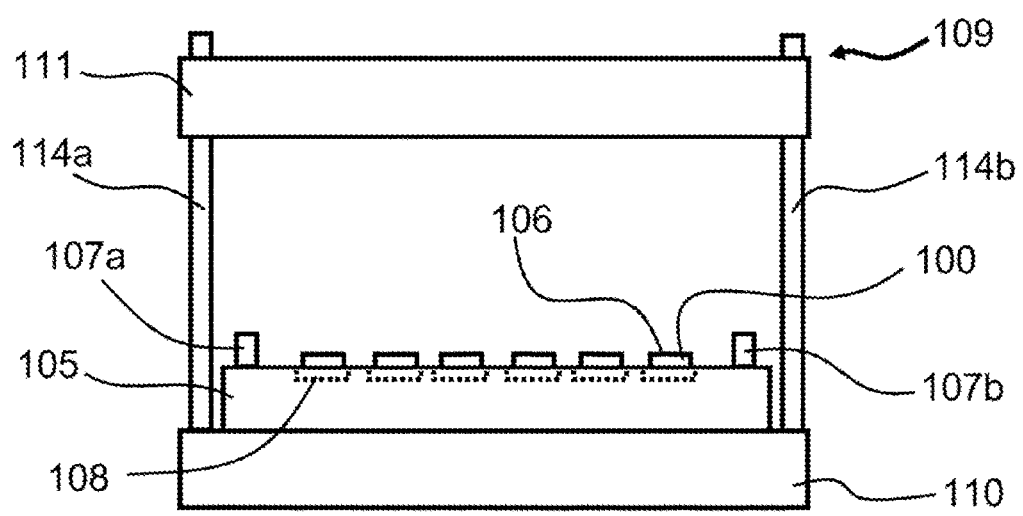
FIG. 5 illustrates, according to a first embodiment of the invention, a stage of the bonding process where the support of FIG. 4 is placed in a machine.

In the context of the use of the mechanical grip as support 105, it is possible to use a machine 109 provided with a lower support element 110 and with an upper support element 111 movable with respect to the lower support element 110, for example by using guides 114a, 114b (FIGS. 5 to 9) belonging to this machine 109. This lower support element 110 and this upper support element 111 can also each be called a "chuck". In this case, the bonding process can be such that the support 105 on which the chips 100 rest is positioned on the lower support element 110 with the chips 100 facing the upper support element 111 (FIG. 5). Subsequently, the abutment(s) 107a, 107b are positioned on the support 105 (FIG. 5) before positioning the substrate 101 against the abutment(s) 107a, 107b (FIG. 6), which results in the liquid film 103 being brought into contact with the chips 100. Thus, here, it is the substrate 101 which approaches the support 105. The upper support element 111 can subsequently be lowered in the direction of the lower support element 110 (FIG. 7) until it comes into contact with the substrate 101 to grasp it, for example by suction, before being raised (FIG. 8) to move the substrate 101 and the support 105 apart in order to remove the chips 100 from the cavities 108 before bonding the chips 100 to the substrate 101 (FIG. 9). The advantage is here to guarantee the horizontality of the substrate 101 to prevent the chips 100 from sliding.

It is possible not to use the abutment(s) 107a, 107b, preferably if the displacement of the upper support element 111 is precisely controlled: it is then possible to fix the substrate 101 to the upper support element 111, then to lower the support element 111 to a chosen height in order to bring the liquid film 103 into contact with the chips 100 and subsequently to raise the upper support element 111 with the chips 100 held with the liquid film 103. There is subsequently a wait for the evaporation of the liquid film 103 making possible the bonding of the chips 100 to the substrate 101.

For example, the chips 100 protrude from the cavities 108, at the surface of the mechanical grip, on average by 100 µm. The chips 100 can exhibit variable thicknesses of plus or minus 50 µm. The abutments 107a, 107b can, according to this example, exhibit a thickness of 150 µm to form spacers separating the substrate 101 from the support 105 by 150 µm when the abutments are in contact, on the one hand, with the support 105 and, on the other hand, with the substrate 101. In this instance, without the liquid film 103, no chip 100 could press against the substrate 101. With the liquid film 103 with a thickness of 100 µm, by capillary action, all the chips 100 are attracted toward the substrate 101 and bond to the latter after the evaporation of the liquid film 103.

According to a separate implementation of the mechanical grip, the support 105 provided can comprise an adhesive film 112 on which the chips 100 are bonded (FIGS. 10 to 15) by adhesion to the adhesive film 112. The adhesive film 112 exhibits an elasticity such that it deforms during the evaporation stage E4, thus making it possible for the chips 100 to approach the substrate 101 as the liquid film 103 evaporates. The advantage of using the adhesive film 112 is that the positioning of the chips 100 with respect to one another is optimized while preventing in particular the movements of the chips 100 with respect to the adhesive film 112 during the bonding or the evaporation of the liquid film 103; this thus results in a more precise bonding because any sliding of the chips 100 over the liquid film 103 is avoided, in comparison with the use of the mechanical grip having cavities 108. After bonding of the chips 100 to the substrate 101, the bonding process can comprise a stage of removal of the adhesive film 112 (FIGS. 15 and 16) with respect to the chips 100. This stage of removal of the adhesive film 112 can comprise a stage of treating the adhesive film 112 (FIG. 15) for the purpose of separating it from the chips 100. For example, this treatment stage makes it possible to reduce the adherence of the adhesive film in order to facilitate its removal, for example by peeling (FIG. 16) by pulling on the adhesive film 112 according to the arrow F2.

Figure 15:
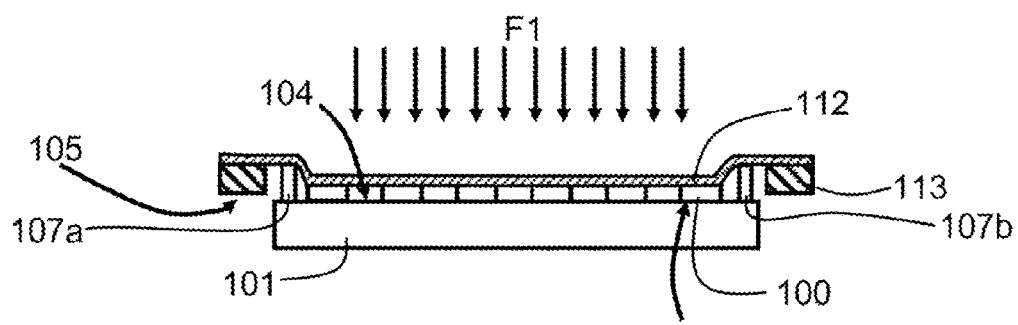
FIG. 15 illustrates, according to the second embodiment, a treatment of the adhesive film of the support for the purpose of detaching it from the chips.

For example, the stage of removal of the adhesive film 112 can comprise a stage of treatment (represented by the row of arrows F1 directed toward the adhesive film 112 in FIG. 15) of the adhesive film 112 by heating the adhesive film 112 or by exposure of the adhesive film 112 to ultraviolet radiation. The heating makes it possible to facilitate the removal of the adhesive film 112 when the latter is thermally loosened. The exposure of the adhesive film 112 to ultraviolet radiation makes it possible to facilitate the removal of the adhesive film when the latter is loosened by exposure to UV (abbreviation of ultraviolet) radiation.

In the case where the support 105 comprises the adhesive film 112, the adhesive film 112 can be held at its periphery by adhesion to a frame 113 (FIGS. 10 to 15), also called a ring, which makes it possible to provide the function of support of the adhesive film 112. In FIGS. 10 and 12 to 16, the support 105 is represented along a side section to make these figures easier to understand.

In the case where the support 105 comprises the adhesive film 112, the bonding process can comprise bonding the abutment(s) 107a, 107b to the adhesive film 112 and bringing the abutment(s) 107a, 107b into contact with the substrate 101 after the bonding of the abutment(s) 107a, 107b to the adhesive film 112. In this case, at the moment of contact, that is to say of the bringing of the abutment(s) 107a, 107b into contact with the substrate 101, the chips 100 are in contact with the liquid film 103, this making possible easy control of the distance and of the parallelism between the chips 100 and the substrate 101. In other words, the presence of the abutment(s) 107a, 107b can make it possible to guarantee an appropriate distance between the chips 100 and the substrate 101, and thus to guarantee that the liquid film 103 will touch the different chips 100 in the same way. Preferably, the frame 113, the abutment(s) 107a, 107b and the chips 100 are bonded to one and the same face of the adhesive film 112. For example, the presence of the abutment(s) 107a, 107b bonded to the adhesive film 112 on which the chips 100 are also bonded makes it possible to guarantee, when the abutment(s) 107a, 107b are brought into contact with the substrate 101, bringing the chips 100 into contact with the liquid film 103 without having to take into account the thickness of the adhesive film 112 in the dimensioning of the abutment(s) 107a, 107b: different adhesive films 112 of different thicknesses can then be used.

In the context of the use of the adhesive film 112, the support 105 can be placed either below the substrate 101 or above the substrate 101, during the abovementioned bringing together of the support 105 and the substrate 101. In the example illustrated in FIGS. 12 to 14, the support 105 is placed above the substrate 101, from which it results that the substrate 101 and the support 105 are brought together by carrying out a displacement of the support 105 toward the substrate 101, the substrate 101 then remaining fixed. The support 105 and the substrate 101 might be reversed as long as the chips 100 face the liquid film 103 so as to make it possible for the chips 100 to come into contact with the liquid film 103.

Figure 16:
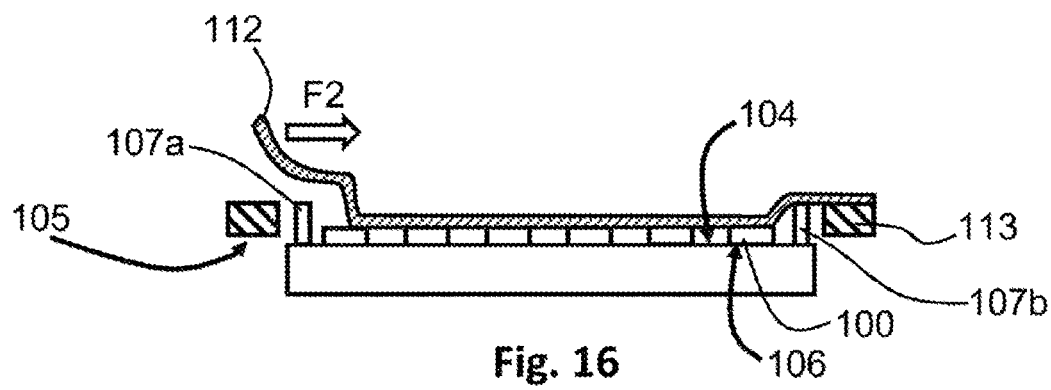
FIG. 16 illustrates, according to the second embodiment, a peeling of the adhesive film ensuring its detachment from the chips.

The abovementioned machine 109 comprising the lower support element 110, the upper support element 111 and the guides 114a, 114b can also be used in the case of the support 105 having an adhesive film 112. However, if the upper support element 111 holds the support 105 by suction, the suction must not be produced in the region of the adhesive film 112 to which the chips 100 are attached in order to make it possible for the adhesive film 112 to deform in order to accompany the chips 100 toward the substrate 101 during the evaporation of the liquid film 103. Thus, the bonding process can be such that:

the support 105 to which the chips 100 are bonded by adhesion to the adhesive film 112 can be placed in contact with the upper support element 111 which then holds the support 105 by suction of the adhesive film 112 in a region of the adhesive film devoid of chips 100 and in contact with the frame 113 (FIG. 12), the substrate 101 is placed on the lower support element 110 (FIG. 12), optionally, the abutment(s) 107a, 107b are bonded to the adhesive film 112 (FIG. 12) or positioned on the substrate 101, the upper support element 111 is lowered toward the lower support element 110 so as to bring the chips 100 into contact with the liquid film 103; preferably, this lowering is limited by the abutment(s) 107a, 107b (FIG. 13), after evaporation of the liquid film 103 in contact with the chips 100, the chips 100 are bonded to the substrate 101 (FIG. 14) and the upper support element 111 can be raised in order to make it possible to withdraw, from the machine 109, the assembly formed by the substrate 101, the chips 100 and the support 105 (FIG. 15) in order to proceed to the separation of the support 105 from the chips 100 by removal of the adhesive film 112 (FIG. 16).

In the context of the use of the adhesive film 112, it is also possible not to use the abutment(s) 107a, 107b, preferably if the displacement of the upper support element 111 is precisely controlled: it is then possible to fix the adhesive film 112 to the upper support element 111 only at the base of the frame 113, then to lower the upper support element 111 to a chosen height in order to bring the liquid film 103 into contact with the chips 100. Subsequently, it suffices to wait for the evaporation of the liquid film 103 and the bonding of the chips 100 without varying the distance between the upper support element 111 and the frame 113 (FIG. 14). It is also possible to gradually lower the support element 111 in order to accompany the evaporation of the liquid film 103.

A specific example of the first embodiment is now described. According to this specific example of the first embodiment, the thickness is measured of three indium phosphide (InP) wafers with a diameter of 50 mm which will be cut out to form the chips 100. The measured thicknesses of these three wafers are all of between 325 µm and 375 µm. The chips 100 are formed by cutting out from the three InP wafers. These chips 100 each exhibit, orthogonally to their thickness, a square profile of 10 mm by 10 mm. The chips 100 are subsequently placed in the cavities 108 of the mechanical grip (FIG. 4) such that the direction of measurement of the thickness of the chips 100 is parallel to the direction of measurement of the depth of the cavities 108. The mechanical grip measures 200 mm. The cavities 108 each exhibit a depth of 250 µm and each comprise a side wall extending from the bottom of the cavity toward the opening of the cavity 108, said side wall exhibiting, orthogonally to the bottom of the corresponding cavity 108, a square profile of 10.2 mm by 10.2 mm. The chips 100 are placed in the cavities 108 by means of a handling device for handling the chips 100, also called a "pick and place machine", while not touching the bonding faces 106 which are going to be bonded by direct bonding to the substrate 101. This handling device can comprise a pyramidal tool which touches only the edges of each chip gripped, a tool forming a claw gripping each chip by its side cut-out edges or a tool using the Venturi effect to grip each chip 100. Subsequently, the chips 100 being in position in the cavities 108 of the mechanical grip, a surface preparation of the InP chips can be carried out with an $O_2$ plasma of 20 seconds to remove the hydrocarbon contamination on the chips 100. The preparation can also comprise a removal of the particulate contamination by a megasonic treatment of the chips 100. This megasonic treatment can be carried out using megasonics and a solution of deionized water with the addition of 2% of ammonia, such a megasonic treatment being known to a person skilled in the art, as is shown, for example, by the document "Innovative megasonic cleaning technology evaluated through direct wafer bonding" by F. Fournel et al., published in ECS Transactions, 33 (4), 495-500 (2010). Optionally, the abutments 107a, 107b then formed of silicon and with a thickness of 150 µm are placed, in particular at the end of the surface preparation of the chips 100, at the periphery of the face of the support 105 in which the cavities 108 are formed (FIG. 5). The assembly is placed on the perfectly flat lower support element 110 within the above-mentioned machine (FIG. 5). The horizontality of the lower support element 110 is preferably of plus or minus 0.1 degree. The substrate 101 can for its part also be prepared in a way conventional for direct bonding, as is shown, for example, in the document "Low Temperature Wafer Bonding" by F. Fournel et al., published in ECS Transactions, 16 (8), 475-488 (2008). Subsequently, the film of deionized water is spread at the surface of the substrate 101 to form the liquid film 103 (FIG. 3). A centrifuging process of 30 revolutions/minute for 20 s can be used to form the liquid film 103 so as to leave, on the surface of the substrate 101, only a film of deionized water having a thickness of approximately 50 µm to 75 µm compatible for coming into contact with the chips 100 when the support 105 (the mechanical grip) and the substrate 101 are separated by the abutments 107a, 107b. Immediately, the substrate 101 is turned over and positioned above the mechanical grip, the chips 100 being brought into contact with the liquid film 103 (FIG. 6). If necessary, this positioning corresponds to placing the substrate 101 on the abutments 107a, 107b positioned on the mechanical grip. Within the machine 109, the suction-applying upper support element 111 is lowered (FIG. 7) onto a face of the substrate 101 opposite its face 104 on which the liquid film 103 is formed. Once the substrate 101 has been sucked up by the upper support element 111, this upper support element 111 is raised by 300 µm while retaining the horizontality of the substrate 101, for example to plus or minus 1 degree, in order to prevent the liquid film 103 from sliding over the surface of the substrate 101, which would have the effect of misaligning the chips 100 to be bonded to the substrate 101. As soon as the time necessary for the evaporation of the liquid film 103 has passed (for example in 4 hours or between 30 minutes and 6 hours at ambient pressure and temperature under 45% humidity), the chips 100 are bonded by direct bonding to the substrate 101 (FIG. 9), and the substrate 101 can be removed from the machine 109.

A specific example of the second embodiment is now described. According to this specific example of the second embodiment, the thickness is measured of three indium phosphide (InP) wafers with a diameter of 50 mm which will be cut out to form the chips 100. The measured thicknesses of these three wafers are all of between 325 µm and 375 µm. The chips 100 are formed by cutting out from the three InP wafers. These chips 100 exhibit, orthogonally to their thickness, a square profile of 10 mm by 10 mm. The chips 100 are subsequently placed on the adhesive film 112, which is, for example, sensitive to ultraviolet radiation and stretched over the frame 113 (FIGS. 10 and 11), the direction of measurement of the thickness of the chips 100 being orthogonal to the plane of the adhesive film 112. Such an adhesive film 112 can be an Adwill D-650 UV-sensitive film from Lintec. The chips 100 can be bonded to the adhesive film 112 using the same handling device as described above. Subsequently, there can be carried out a surface preparation of the chips 100 with a treatment exposing the chips to ultraviolet radiation under an atmosphere comprising ozone, for example for 10 min, in order to remove the organic contaminants of the chips 100, such as hydrocarbons. Subsequently, still in order to prepare the surface of the chips 100 for direct bonding, the particulate contamination can be removed by megasonic treatment, in particular as mentioned above. The abutments 107a, 107b made of silicon, with a thickness of 400 µm, can be placed on the adhesive film 112 (FIG. 12) in particular at the end of the surface preparation of the chips 100, the chips 100 being located between these abutments. The part of the adhesive film 112 in contact with the frame 113 is held in contact with the upper support element 111 of the machine 109, for example as mentioned above, this holding being carried out by suction exerted only on this part of the adhesive film 112 by the upper support element 111, the upper support element 111 being perfectly flat with a horizontality for example to plus or minus 1 degree. The substrate 101 can for its part also be prepared in a way conventional for direct bonding. Subsequently, a film of deionized water is spread at the surface of the substrate 101, in particular prepared, to form the liquid film 103 (FIG. 3). A centrifuging process of 30 revolutions/minute for 20 seconds can be used so as to leave, on the surface of the substrate 101, only a film of deionized water having a thickness of approximately 50 µm to 75 µm compatible for coming into contact with the chips 100 when the support 105 and the substrate 101 are separated by the abutments 107a, 107b. Immediately after having formed the liquid film 103, the substrate 101 is placed on the lower support element 110 (FIG. 12), this lower support 110 being flat and horizontal, for example to plus or minus 0.1 degree. The upper support element 111 is lowered toward the face 104 of the substrate 101 on which the chips 100 have to be bonded until the abutments 107a, 107b are brought into contact with the face 104 of the substrate 101 (FIG. 13). After bringing the chips 100 into contact with the liquid film 103, this liquid film 103 is evaporated, for example in 4 hours or between 30 minutes and 6 hours at ambient pressure and temperature under 45% humidity. Once the time necessary for the evaporation of the liquid film 103 has passed, the upper support element 111 releases the support 105 to which the chips 100 are attached, for example by stopping its suction, and goes back to the high position (FIG. 14). After having taken out of the machine 109 the assembly comprising the support 105, the substrate 101 and the chips 100 bonded to the substrate 101 and to the support 105, the adhesive film 103 is exposed to ultraviolet radiation (FIG. 15) in a way appropriate for making it possible to facilitate the peeling (for example, for the Adwill D-650 UV-sensitive film from Lintec, the appropriate ultraviolet radiation can be 160 mJ/cm$^2$), then peeled off (FIG. 16) in order to separate the adhesive film 112 from the chips 100.

The bonding process according to the present invention exhibits the advantage of providing a technique for the collective transfer of chips 100 in order to bond them by direct bonding to the substrate 101 while taking into account the differences in thickness between the chips 100 ranging from plus or minus 50 µm.

The bonding process described exhibits an industrial application in the field of the bonding of chips by direct bonding to a substrate.

The invention claimed is:

1. A process for bonding chips to a substrate by direct bonding, the bonding process comprising
providing a support comprising an adhesive film with which the chips are in contact, the chips in contact with the adhesive film being separate from one another, forming a liquid film on one face of the substrate, bringing the chips into contact with the liquid film, which action of bringing the chips into contact with the liquid film causes an attraction of the chips toward the substrate, after bringing the chips in contact with the liquid film, separating the support from the adhesive film, the adhesive film remaining connected to the chips, and evaporating the liquid film in order to bond the chips to the substrate by direct bonding.

2. The bonding process as claimed in claim 1, wherein the liquid film is a film of deionized water.

3. The bonding process as claimed in claim 1, wherein forming the liquid film comprises depositing the liquid film on the face of the substrate by centrifuging.

4. The bonding process as claimed in claim 1, wherein bringing the chips into contact with the liquid film is carried out by bringing the substrate and the support together.

5. The bonding process as claimed in claim 4, comprising using at least one abutment arranged between the substrate and the support to halt the bringing together which provides for the chips to be brought into contact with the liquid film, resulting in that, when the bringing together is halted, wherein the chips are in contact with the liquid film, and the liquid film separates each chip from the substrate.

6. The bonding process as claimed in claim 5, wherein the process comprises bonding the abutment to the adhesive film and bringing the abutment into contact with the substrate after the bonding of the abutment to the adhesive film, and at a moment of the contact of the abutment with the substrate, the chips are in contact with the liquid film.

7. The bonding process as claimed in claim 1, wherein:

the adhesive film exhibits an elasticity such that the adhesive deforms during the evaporating, and after bonding of the chips to the substrate, the bonding process comprises removing the adhesive film.

8. The bonding process as claimed in claim 7, wherein removing the adhesive film comprises treating the adhesive film by heating the adhesive film or exposing the adhesive film to ultraviolet radiation.

9. The bonding process as claimed in claim 1, comprising keeping the substrate horizontal to plus or minus 1 degree during the evaporating.

10. The bonding process as claimed in claim 1, comprising, after separating the support from the adhesive film, removing the adhesive film from the chips.

11. A process for bonding chips to a substrate by direct bonding, the bonding process comprising providing a support with which the chips are in contact, the chips in contact with the support being separate from one another, forming a liquid film on one face of the substrate, bringing the chips into contact with the liquid film by bringing the substrate and the support together, which action of bringing the chips into contact with the liquid film causes an attraction of the chips toward the substrate, using at least one abutment arranged between the substrate and the support to halt the bringing together which provides for the chips to be brought into contact with the liquid film, resulting in that, when the bringing together is halted, wherein the chips are in contact with the liquid film, and the liquid film separates each chip from the substrate, and evaporating the liquid film in order to bond the chips to the substrate by direct bonding.

12. The bonding process as claimed in claim 11, wherein the support is a mechanical grip on which the chips rest.

13. The bonding process as claimed in claim 12, wherein the mechanical grip comprises cavities, each chip being positioned in one of the cavities and protruding from the one cavity, the process further comprising removing the chips from the cavities after the chips are brought into contact with the liquid film and before the chips are bonded to the substrate.

14. The process as claimed in claim 13, wherein removing the chips from the cavities is carried out by moving the support and the substrate apart.

15. The bonding process as claimed in claim 11, wherein:

the support is a mechanical grip on which the chips rest, the process comprises positioning the at least one abutment on the mechanical grip and bringing the substrate into contact with the abutment after having positioned the abutment on the mechanical grip, and at a moment of the contact of the substrate with the abutment, the chips are in contact with the liquid film.

* * * * *